(12) United States Patent
Chen et al.

(10) Patent No.: US 6,660,618 B1
(45) Date of Patent: Dec. 9, 2003

(54) REVERSE MASK AND OXIDE LAYER DEPOSITION FOR REDUCTION OF VERTICAL CAPACITANCE VARIATION IN MULTI-LAYER METALLIZATION SYSTEMS

(75) Inventors: Susan H. Chen, Santa Clara, CA (US); Paul R. Besser, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 70 days.

(21) Appl. No.: 09/640,080

(22) Filed: Aug. 17, 2000

Related U.S. Application Data

(60) Provisional application No. 60/149,427, filed on Aug. 18, 1999.

(51) Int. Cl.⁷ .............................................. H01L 21/20
(52) U.S. Cl. ...................... 438/584; 438/622; 438/645; 438/699
(58) Field of Search ............................. 438/584, 697, 438/699, 976, 623, 622, 624, 633, 645, 691

(56) References Cited

U.S. PATENT DOCUMENTS

| | | | | |
|---|---|---|---|---|
| 3,976,524 A | * | 8/1976 | Feng | 427/335 |
| 5,350,486 A | * | 9/1994 | Huang | 156/633 |
| 5,591,677 A | | 1/1997 | Jeng | 437/195 |
| 5,792,707 A | * | 8/1998 | Chung | 438/633 |
| 5,804,514 A | * | 9/1998 | Kwon | 438/697 |
| 5,818,111 A | * | 10/1998 | Jeng et al. | 257/776 |
| 5,880,003 A | * | 3/1999 | Hayashi | 438/405 |
| 5,904,558 A | * | 5/1999 | Suzuki | 438/633 |
| 6,030,706 A | * | 2/2000 | Eissa et al. | 428/421 |
| 6,057,242 A | * | 5/2000 | Kishimoto | 438/692 |
| 6,071,809 A | * | 6/2000 | Zhao | 438/634 |
| 6,087,724 A | * | 7/2000 | Shields et al. | 257/734 |
| 6,090,713 A | * | 7/2000 | Karlsson et al. | 438/691 |
| 6,114,186 A | * | 9/2000 | Jeng et al. | 438/623 |
| 6,124,640 A | * | 9/2000 | Sahota et al. | 257/758 |
| 6,207,554 B1 | * | 3/2001 | Xu et al. | 438/624 |
| 6,280,644 B1 | * | 8/2001 | Martin et al. | 216/38 |
| 6,291,339 B1 | * | 9/2001 | Avanzino et al. | 438/633 |

FOREIGN PATENT DOCUMENTS

| JP | 2000223573 A | * | 8/2000 | ......... H01L/21/768 |

* cited by examiner

*Primary Examiner*—Matthew Smith
*Assistant Examiner*—Renzo N Rocchegiani

(57) ABSTRACT

Excessive variation in vertical (i.e., inter-level) capacitance of multi-level metallization semiconductor devices resulting in racing of clock skew circuitry of finished devices, and over-etching of borderless vias leading to inter-level short-circuits, are simultaneously eliminated, or substantially reduced, by selectively providing an etch-resistant masking material at thinner, i.e., recessed, portions of a first, low k gap fill material blanket-deposited over spaced-apart features of a metallization pattern and in the spaces therebetween. The surfaces of thicker, non-recessed portions thereof are etched so as to be substantially co-planar with the feature surfaces and the recessed portions. The etch-resistant mask is then removed, and second, oxide-based and third, low k dielectric layers deposited over the planarized surface. The second and third dielectric layers are selected such that the second dielectric layer etches at a substantially slower rate than the third dielectric layer and thus serves as a partial etch stop layer, thereby preventing deleterious over-etching of the borderless via.

14 Claims, 2 Drawing Sheets

REVERSE MASK AND OXIDE LAYER DEPOSITION FOR REDUCTION OF VERTICAL CAPACITANCE VARIATION IN MULTI-LAYER METALLIZATION SYSTEMS

RELATED APPLICATIONS

This application claims priority from Provisional Application Ser. No. 60/149,427 filed on Aug. 18, 1999 entitled: "REVERSE MASK AND OXIDE LAYER DEPOSITION FOR REDUCTION OF VERTICAL CAPACITANCE VARIATION IN MULTI-LAYER METALLIZATION SYSTEMS", the entire disclosure of which is hereby incorporated by reference therein.

CROSS-REFERENCE TO RELATED APPLICATION

This application contains subject matter similar to subject matter disclosed in co-pending U.S. patent application Ser. No. 09/639,813, filed on Aug. 17, 2000.

FIELD OF THE INVENTION

The present invention relates to the formation of high-density, multi-layer metallization semiconductor devices with reduced vertical capacitance variation. The invention has particular applicability in the manufacture of high-density, multi-layer metallization semiconductor devices with design features in the deep submicron range, such as 0.18 μm and below, e.g., 0.15 μm and below.

BACKGROUND OF THE INVENTION

The present invention relates to a method for forming semiconductor devices comprising multi-layer metallization systems with reduced vertical capacitance variation, and multi-layer metallization semiconductor devices obtained thereby, such as, for example, devices including clock skew circuits which must have very small variation in capacitance in order to avoid a racing condition. The present invention is especially adapted for use in semiconductor device manufacturing processing employing "damascene" (or "in-laid") technology.

The escalating requirements for high density and performance associated with ultra-large scale integration (ULSI) semiconductor device wiring are difficult to satisfy in terms of providing submicron-dimensioned (such as 0.18 μm and below, e.g., 0.15 μm and below), low resistance-capacitance (RC) time constant metallization patterns, particularly when the submicron-dimensioned metallization features, such as vias, contact areas, grooves, trenches, etc., have high aspect (i.e., depth-to-width) ratios due to microminiaturization.

Semiconductor devices of the type contemplated herein typically comprise a semiconductor wafer substrate, usually of doped monocrystalline silicon (Si), and a plurality of sequentially formed interlayer dielectrics and conductive patterns formed therein and/or therebetween. An integrated circuit is formed therefrom containing a plurality of patterns of conductive lines separated by interwiring spacings and a plurality of interconnect lines, such as bus lines, bit lines, word lines, and logic interconnect lines. Typically, the conductive patterns of vertically spaced-apart metallization layers are electrically connected by a vertically oriented conductive plug filling a via hole formed in the inter-layer dielectric layer separating the layers, while another conductive plug filling a contact area hole establishes electrical contact with an active device region, such as a source/drain region, formed in or on the semiconductor substrate. Conductive lines formed in groove- or trench-like openings in overlying inter-layer dielectrics extend substantially parallel to the semiconductor substrate. Semiconductor devices of such type fabricated according to current technology may comprise five or more layers of such metallization in order to satisfy device geometry and miniaturization requirements.

As device geometries shrink and the number of metallization levels increases, it has become increasingly important to reduce and/or stabilize the resistance-capacitance ("RC") time constant of multi-level metallization systems at a particular value. Lower RC time constants are typically obtained by replacing typical silicon dioxide ($SiO_2$)-based dielectrics having high dielectric constants (i.e., above about 3.9) with low dielectric constant ("low k") materials having dielectric constants below 3.9, such as, inter alia, hydrogen silsesquioxane (HSQ), benzocyclobutene (BCB), polytetrafluoroethylene (TEFLON™), parylene, and polyimide. However, variation of inter-layer dielectric (ILD) thickness can result in significant variation in the capacitance between vertically separated metallization levels, thereby disadvantageously resulting in a variation of RC time constant which can cause a racing condition to occur in devices including clock skew circuitry. The variation in vertical capacitance between overlying metallization levels is particularly troublesome when the above-mentioned low k materials are employed as gap fill between metallization features having different linewidths and inter-line spacings because the spin-on coating techniques typically employed for their application cannot provide the required degree of thickness uniformity for minimum vertical capacitance variation over the lateral extent of the device substrate.

Referring now to FIG. 1, shown therein for facilitating an understanding of the present invention, is a very schematic sectional view through a semiconductor device having a ground plane 5 disposed substantially parallel to metal interconnect lines 1–4. Electrical signals carried by each of interconnect lines 1–4 are affected by the RC time constant of that particular line. In the case of line 1, the capacitance element of the RC time constant comprises four components: the first capacitance component $C_{12}$ is the line-to-line capacitance between lines 1 and 2; the second capacitance component $C_{13}$ is the interlayer vertical capacitance between line 1 and vertically underlying line 3; the third capacitance component $C_{14}$ is the interlayer diagonal capacitance between line 1 and diagonally underlying line 4; and the fourth capacitance component $C_{15}$ is the line-to-ground capacitance between line 1 and ground 5. Finally, $C_{11}$ is the total capacitance. While calculations indicate that the first, or line-to-line capacitance $C_{12}$ is the major component of the total capacitance $C_{11}$, variation of $C_{12}$ can be minimized by use of high resolution, high precision pattern definition, masking, and etching techniques which provide substantially constant line widths and inter-line spacings. However, formation (e.g., as by spin-on deposition techniques of interlayer dielectric layers (ILDs) having highly uniform (i.e., constant) thickness over the wafer substrate surface is extremely difficult according to conventional practices. As a consequence, variation of the total capacitance $C_{11}$ due to variation of the interlayer vertical capacitance component $C_{13}$ and the interlayer diagonal capacitance component $C_{14}$ because of such thickness variation of the various interlayer dielectric layers is problematic in the manufacture of multi-level metallization semiconductor devices, resulting in excessive variation in device speed, creation of racing conditions in certain clock skew circuits, reduced product quality, and low manufacturing yield.

Another difficulty or drawback associated with the trend towards reduction of conductive wirings and interwiring spacings to the deep submicron range (i.e., 0.18 μm and below) stems from the inability to satisfactorily fill the interwiring spacings voidlessly and obtain adequate step coverage. It has also become very difficult to form reliable interconnection structures. In forming a conventional via, a through-hole is typically formed in a dielectric layer to expose an underlying metal feature, wherein the metal feature serves as a "landing pad" occupying the entire bottom of the through-hole. Upon filling the through-hole with conductive material, such as a metal plug forming a conductive via, the entire bottom surface of the conductive via plug is in direct contact with the metal feature.

A conventional fully bordered via, such as described above, is schematically illustrated in cross-section in FIG. 2, wherein first metal feature 10 of a first patterned metal layer is formed on first dielectric layer 11 and exposed by through-hole 12 formed in second dielectric layer 13. First metal feature 10 comprises side surfaces which taper somewhat due to the etching process employed for their definition. In accordance with conventional practices, through-hole 12 is formed so that first metal feature 10 encloses the entire area of the opening at its bottom, thereby serving as a landing pad for the metal plug filling through-hole 12 for forming the conductive via. Thus, the entire bottom surface of conductive via plug 16 is in direct contact with the upper surface of the first metal feature 10. Conductive via plug 16 electrically connects first metal feature 10 and second metal feature 14 which is part of a second patterned metal layer, i.e., a second metallization level.

However, in the case of fabricating deep submicron-dimensioned, ultra-high density integration devices, the above-described conventional practice of forming a landing pad completely enclosing the bottom surface of a conductive via plug is incompatible with the escalating densification and miniaturization requirements of such devices, principally because conventional full-contact via formation utilizes too large an area on a semiconductor chip and the dimensions of the features to be contacted are simply too small to permit full-area contacting utilizing existing methodologies. In addition, it is extremely difficult to voidlessly fill through-holes having such reduced dimensions as required for such micro-dimensioned features because of the extremely high aspect ratios encountered, e.g., in excess of 4–5. As a consequence, conventional techniques for alleviating or avoiding such difficulties comprise purposefully widening the diameter of the through-hole so as to decrease the aspect ratio. As a result, a misalignment occurs wherein the bottom surface of the conductive via plug is not completely enclosed by the underlying metal feature. The likelihood of such occurrence increases as feature sizes decrease. This type of via is termed a "borderless via", which via type can advantageously require smaller surface areas of the semiconductor chip vis-a-vis conventional full-contact vias.

However, the use of borderless vias is also problematic in that a side surface of the underlying (i.e., lower) metal feature is exposed to etching during etching of the interlayer dielectric layer to form the through-hole, particularly when the interlayer dielectric is too rapidly attacked by the etchant. As a consequence, undesirable formation of an etched undercut portion of the side surface of the metal feature can occur. Adverting to FIG. 3, shown therein in schematic cross-sectional view is a portion of a metallization system illustrating formation of a borderless via according to conventional methodology, wherein first metal feature 20, which is part of a first metal layer, is formed on first dielectric layer 21. A second dielectric layer 22 is formed on the first patterned metal layer and through-hole 23 etched therein, which through-hole is purposefully misaligned, thereby exposing a portion 24 of the upper surface of first metal feature 20 and etching away a portion of a side surface of first metal feature 20 to form an etched portion in the form of a concavity 25 extending below the upper surface of first metal feature 20. The difficulty of filling a borderless via itself having a high aspect ratio is exacerbated by the even higher aspect ratio of the portion of the via comprising the concavity 25.

Accordingly, there exists a need for an improved methodology for forming submicron-dimensioned, multi-level metallization, high-density integration semiconductor devices which substantially avoids or at least minimizes the above-described drawbacks and difficulties of the conventional art, i.e., variation of vertical capacitance which, inter alia, induces racing condition in clock skew circuits, and diminishes product quality and performance. In addition, there exists a need for a process which eliminates, or at least minimizes, over-etching of borderless vias resulting in very high aspect ratio openings which are difficult to voidlessly fill with conductive via plug material.

DISCLOSURE OF THE INVENTION

An advantage of the present invention is a method of manufacturing an improved multi-level metallization, high density integration, submicron-dimensioned semiconductor device wherein vertical capacitance variation between overlying metallization levels is substantially and significantly reduced vis-a-vis conventional multi-level metallization devices.

Another advantage of the present invention is an improved method of manufacturing multi-level metallization, high-density integration, submicron-dimensioned semiconductor devices comprising at least one voidlessly-filled borderless via.

Yet another advantage of the present invention is a method of manufacturing improved multi-level metallization, high-density integration, submicron-dimensioned devices exhibiting reduced variation of vertical capacitance between overlying metallization levels and including at least one improved, voidlessly-filled borderless via.

Still another advantage of the present invention is an improved multi-metallization level, high-density integration, submicron-dimensioned semiconductor integrated circuit device exhibiting reduced variation of vertical capacitance between overlying metallization levels and including at least one improved, voidlessly-filled borderless via.

Additional advantages and other features of the present invention will be set forth in the description which follows and in part will become apparent to those having ordinary skill in the art upon examination of the following or may be learned from the practice of the present invention. The advantages of the present invention may be realized and obtained as particularly pointed out in the appended claims.

According to one aspect of the present invention, the foregoing and other advantages are achieved in part by a method of manufacturing a semiconductor device comprising a multi-layer metallization system having reduced variation of vertical capacitance, which method comprises the sequential steps of:

(a) providing a substrate comprising a laterally extending surface having a plurality of spaced apart, electrically conductive, substantially equal thickness features formed thereon, the plurality of features including relatively narrow and relatively wide features with relatively narrow and relatively wide spaces between adjacent features;

(b) forming a first, blanket layer of a low dielectric constant ("low k") material over the substrate surface, the blanket layer filling the spaces between adjacent features and covering the features, the thickness of the blanket layer varying over the laterally extending surface and including thinner, recessed portions in the relatively wide spaces between adjacent features and thicker, non-recessed portions;

(c) selectively forming a layer of an etch-resistant mask material over the thinner, recessed portions of the blanket layer;

(d) selectively etching the thicker, non-recessed portions of the blanket layer of first, low k material exposed by the layer of mask material to substantially planarize the surface thereof;

(e) removing the layer of etch-resistant mask material;

(f) successively forming a relatively thinner layer of a second, oxide-based dielectric material and a relatively thicker layer of a third, low k material on the planarized surface of the layer of first, low k material; and (g) forming at least one via extending through the second and third dielectric material layers by an etching process.

In embodiments according to the invention, step (g) comprises forming the at least one via as a borderless via for electrically contacting a said relatively narrow feature by an etching process wherein the second, oxide-based dielectric material layer is etched at a rate substantially slower than the rate of etching of the third, low k layer, whereby the second dielectric layer functions as a partial etch stop or moderating layer preventing over-etching of the borderless via; and step (a) comprises providing a semiconductor wafer substrate, e.g., of silicon or gallium arsenide, having a dielectric layer formed thereon and comprising the laterally extending surface, and the plurality of electrically conductive features comprise electrical contact areas, interlevel metallization, and/or interconnection routing of at least one active device region or component formed on or within the semiconductor wafer.

In further embodiments according to the invention, step (b) comprises forming the first, blanket layer of a low k material selected from the group consisting of hydrogen silsesquioxane (HSQ), benzocyclobutene (BCB), polytetrafluoroethylene (TEFLON™), parylene, and polyimide; step (c) comprises forming a patterned layer of a photoresist; step (d) comprises wet or dry etching of the blanket layer of first, low k material; step (f) comprises successively forming a relatively thin silicon oxide second dielectric material layer and a relatively thicker layer of a third, low k material and selected from the group of materials employed for the first, low k layer; step (g) comprises preferentially and selectively etching at least one preselected portion of the third, low k layer; and the method comprising the further step (h) of filling the at least one via with a plug of an electrically conductive material.

Another aspect of the present invention is a method of manufacturing a semiconductor device comprising a multi-layer metallization system having reduced variation of vertical capacitance, which method comprises the sequential steps of:

(a) providing a silicon wafer substrate having a laterally extending major surface with a dielectric layer formed thereon, with a plurality of spaced-apart, electrically conductive features of substantially equal thickness formed on or in a surface of the dielectric layer for providing electrical contact areas, interlevel metallization, and/or interconnection routing of at least one active device region or component formed on or within the wafer substrate, the plurality of conductive features including relatively narrow and relatively wide features with relatively narrow and relatively wide spaces between adjacent features;

(b) forming a first, blanket layer of a low k material filling the spaces between adjacent features and covering the features, the thickness of the blanket layer varying over the laterally extending surface of the wafer substrate and including thinner, recessed portions in the relatively wide spaces between adjacent features and thicker, non-recessed portions;

(c) selectively forming a layer of an etch-resistant mask material over the recessed portions of the blanket layer;

(d) selectively etching the thicker, non-recessed portions of the blanket layer of first, low k material, thereby substantially planarizing the surface thereof;

(e) removing the layer of etch-resistant mask material;

(f) successively forming a relatively thinner layer of a second, oxide-based dielectric material and a relatively thicker layer of a third, low k material on the planarized surface of the layer of first, low k dielectric material;

(g) forming at least one via extending through the second and third dielectric layers by means of an etching process wherein the layer of third, low k material is etched at a substantially greater rate than the layer of second, oxide-based dielectric material, thereby preventing or at least minimizing over-etching of the at least one via; and (h) filling the at least one via with a plug of an electrically conductive material.

In embodiments according to the present invention, step (f) comprises forming a relatively thinner silicon oxide second dielectric material layer and a relatively thicker third, low k layer; and step (g) comprises forming the at least one via as a borderless via for electrically contacting a relatively narrow feature.

Yet another aspect of the present invention is a semiconductor device including a multi-level metallization system having reduced variation of vertical capacitance, comprising:

a silicon wafer substrate having a laterally extending major surface with a dielectric layer formed thereon, a plurality of spaced-apart, electrically conductive features of substantially equal thickness formed on or in a surface of the dielectric layer for providing electrical contact areas, interlevel metallization, and/or interconnection routing of at least one active device region or component formed on or within said wafer substrate, said plurality of conductive features including relatively narrow and relatively wide features with relatively narrow and relatively wide spaces between adjacent features;

a layer of a first, low k material filling the spaces between adjacent features and having a surface substantially co-planar with the surfaces of the conductive features;

a relatively thinner layer of a second, silicon oxide dielectric material and a relatively thicker layer of a third, low k dielectric material successively formed over the conductive features and the co-planar layer of first, low k material, the third, low k material being etchable by a preselected setchant at a rate substantially greater than that of the second dielectric material; and at least one via extending through the second and third dielectric material layers for providing electrical contact to a conductive feature.

In embodiments according to the present invention, the at least one via is a borderless via for providing electrical contact to a relatively narrow conductive feature; and the layer of first, low k material is selected from the group consisting of hydrogen silsesquioxane (HSQ), benzocyclobutene (BCB), polytetrafluoroethylene (TEFLON™), parylene, and polyimide; the relatively thinner second layer of dielectric material comprises a layer of a silicon oxide; and the relatively thicker third layer of a low k material comprises a layer of a material selected from the group of materials utilized for the first, low k layer.

Additional advantages of the present invention will become readily apparent to those skilled in the art from the following detailed description, wherein only the preferred embodiment of the present invention is shown and described, simply by way of illustration of the best mode contemplated for carrying out the method of the present invention. As will be described, the present invention is capable of other and different embodiments, and its several details are susceptible of modification in various obvious respects, all without departing from the spirit of the present invention. Accordingly, the drawing and description are to be regarded as illustrative in nature, and not as limitative.

BRIEF DESCRIPTION OF THE DRAWINGS

The following detailed description of the embodiment of the present invention can best be understood when read in conjunction with the following drawings, in which.

DESCRIPTION OF THE INVENTION

The present invention addresses and solves problems arising from manufacturing high-density integration, submicron-dimensioned, multi-metallization level semiconductor devices comprising in-laid "back-end" metallization patterns comprising a plurality of spaced-apart conductive features of varying dimensions and spacings, wherein, as part of the fabrication methodology, at least one via is formed in an interlayer dielectric ("ILD") layer, for electrically contacting at least one underlying electrically conductive feature formed on or within a dielectric layer formed on a surface of a semiconductor wafer substrate, the at least one conductive feature comprising an electrical contact area, interlevel metallization, and/or interconnection routing of at least one active device region or component formed on or within the semiconductor wafer substrate, and the at least one via comprising at least one borderless via.

Briefly stated, according to the present invention, problems of excessive variation in vertical (i.e., inter-level) capacitance of multi-level metallization systems leading to, inter alia, excessive variation of vertical capacitance leading to a racing condition of certain finished devices comprising clock skew circuits and uncontrollable over-etching of borderless vias resulting in inter-level short-circuiting, are simultaneously eliminated, or at least minimized, by the inventive process wherein an etch-resistant masking material is selectively provided at thinner, i.e., recessed, portions of a first, low dielectric constant ("low k") material blanket-deposited over the spaced-apart features of a metallization pattern and in the spaces therebetween, the surfaces of thicker, non-recessed portions of the low k material are etched so as to be substantially co-planar with the feature surfaces and the thinner, recessed portions of the low k material, the etch-resistant mask is removed, and relatively thinner and relatively thicker layers of a second, silicon oxide-based and a third, low k dielectric materials are successively deposited over the planarized surface of the first, low k material. The substantially constant thickness of each of the dielectric layers minimizes variation in vertical capacitance. In addition, the second, silicon oxide-based dielectric material can be selected so as to etch at a substantially slower rate than the third, low k dielectric material for a selected etchant material or etching process, thereby effectively serving as an etch stop or moderating layer for preventing over-etching of borderless vias resulting in inter-level short-circuiting.

Figure 4:
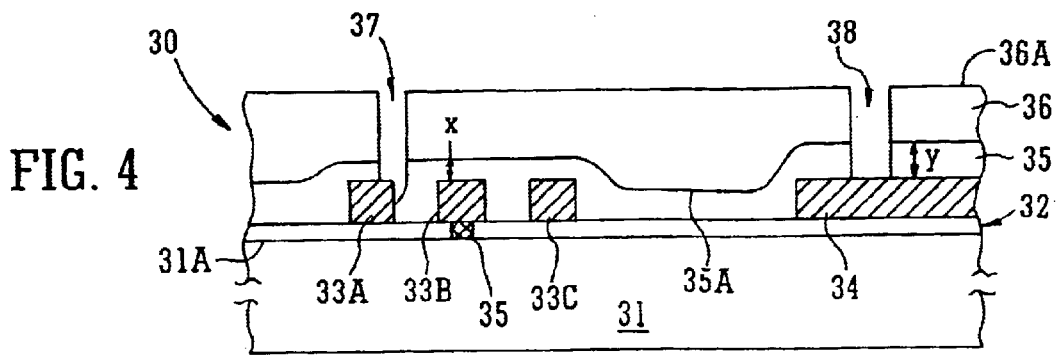
FIG. 4 illustrates, in simplified cross-sectional form, a portion of a semiconductor device formed according to conventional practice and having an "in-laid" back-end metallization system including bordered and borderless vias.

FIG. 4 is illustrative of the above-described problems attendant upon manufacture of multi-level metallization semiconductor devices by conventional processing methodology and FIGS. 5(A)–5(D) show a sequence of steps for performing an illustrative, but not limitative, embodiment of the present invention, wherein similar reference numerals are used throughout to denote similar features. As will be apparent to one of ordinary skill in the art, the inventive process is readily adapted for use in the manufacture of a variety of integrated circuit semiconductor devices. It should also be recognized that the process steps and structures described below do not necessarily form a complete process flow for manufacturing such semiconductor devices. However, the present invention can be practiced in conjunction with conventional integrated circuit fabrication techniques and methodologies currently employed in the art, and only so much of the commonly practiced process steps are included here as are necessary for an understanding of the present invention. As employed throughout the present disclosure and claims, the term "substrate" and/or "semiconductor wafer substrate" includes, e.g., a semiconductor substrate per se or an epitaxial layer formed on a suitable semiconductor substrate. Finally, the figures representing cross-sections of portions of a semiconductor device during fabrication processing are not drawn to scale, but instead are drawn as to best illustrate the features of the present invention.

Referring now more particularly to FIG. 4, shown therein is a portion of a semiconductor device 30 immediately after formation of via openings in a laminate of inter-layer dielectric layers for providing electrical contact and/or interconnection to an underlying level of patterned electrically conductive lines, interconnects, etc., fabricated according to conventional processing methodologies. More specifically, device 30 comprises semiconductor substrate body 31, which may, for example, contain transistors, diodes, and other semiconductor elements (not shown for illustrative simplicity), as are well known in the art. Insulator layer 32, e.g., a silicon oxide or nitride layer, is formed on the laterally extending major surface 31A of semiconductor substrate 31 to isolate the structures, device components, etc. of substrate 31 from relatively narrow and relatively wide lines 33A, 33B, 33C and 34, respectively. Contacts, illustratively shown at 35, may be selectively formed as to extend through insulator layer 32 to connect particular ones of the lines (e.g., 33B) to substrate 31. The electrically conductive lines, etc. 33A–33C and 34 are typically made of a metal, metal alloy, or a multi-layer metal laminate, such as, by way of illustration but not limitation, aluminum or an aluminum alloy, or a titanium nitride/aluminum/titanium nitride multi-layer laminate. Relatively narrow lines or features 33A–33C typically have relatively narrow spacings between adjacent lines or features, whereas relatively wide feature 34 is located at a relatively wide spacing from relatively narrow line or feature 33C.

Figure 1:
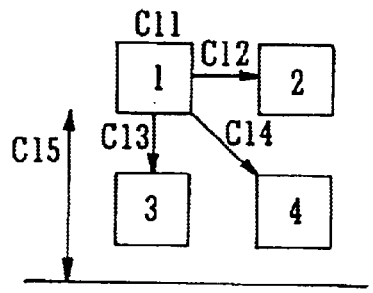
FIG. 1 is a block diagram of a multi-level interconnect device.
Figure 2:
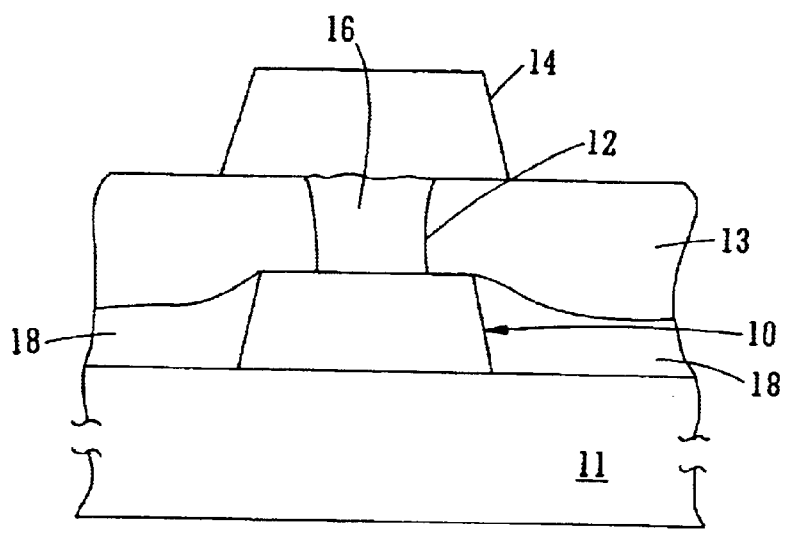
FIG. 2 illustrates, in simplified cross-sectional form, a portion of a semiconductor device "back-end" metallization system including a fully bordered via formed according to the conventional art.

First inter-layer dielectric ("ILD") layer 35, which functions as gap-fill for the spaces between adjacent features 33A–33C and 34, comprises a low k (i.e., k<3.9) material, and is typically selected from hydrogen silsesquioxane (HSQ), benzocyclobutene (BCB), polytetrafluoroethylene (TEFLON™), parylene, and polyimide. The low k gap-fill, first ILD layer 35 isolates adjacent features 33A–33C from each other and is utilized in areas of device 30 that have the maximum impact on inter-feature capacitance, i.e., for reducing line-to-line capacitance $C_{12}$, as described supra with respect to FIG. 1. Low k first ILD layer 35 is typically blanket-deposited, as by spin-on techniques, in an excess or "overburden" thickness, so as to fill the gaps between adjacent features and provide at least a minimum overburden thickness covering the upper surfaces of the features, and is itself covered by a second ILD layer 36, typically of a silicon oxide, the upper surface 36A of which is planarized, as by conventional techniques, such as, for example, chemical-mechanical polishing (CMP). However, uniform overburden thickness deposition of gap-fill first ILD layers over a pattern of features having widely varying widths and spacings is problematic according to conventional spin-on coating methodologies typically employed for applying the gap gill layer 35. For example, by way of illustration, but not limitation, in the embodiment shown in FIG. 4, the thickness X of the overburden portion of low k first ILD layer 35 over the relatively narrow and relatively closely spaced features 33A–33C is considerably less than the thickness y of the overburden portion of layer 35 over the relatively wide feature 34. In addition to the non-uniform thickness overburden portions, recessed portions of first ILD layer, illustratively 35A, are formed in the relatively wide spaces between adjacent features, as between relatively narrow feature 33C and relatively wide feature 34. The variation of the overall dielectric constant of the laminate of ILD layers of different dielectric constants resulting from the non-uniformity of the thickness of each of the component layers, as should be apparent from the previous reference to FIG. 1, adversely affects the vertical capacitance characteristics of the finished device by causing variation of the vertical capacitance over the lateral extent of the device, which variation can result in a racing condition of devices comprising clock skew circuits.

Also shown in FIG. 4 are borderless and fully bordered vias 37 and 38, respectively, extending through the first and second ILD layers, for providing electrical contact to conductive features 33A and 34. As illustrated, borderless via 37 is overetched and includes a very narrow, very high aspect ratio, concavely-shaped portion analogous to that indicated at 25 in FIG. 3, which portion can, in certain instances, cause electrical short-circuiting to an underlying electrically conductive line or feature, and is extremely difficult to voidlessly fill with a plug of electrically conductive material, e.g., metal.

Referring now to FIGS. 5(A)–5(D), shown therein is a sequence of processing steps performed according to the inventive methodology which simultaneously eliminate, or at least minimize, the above-described drawbacks and problems of the conventional art pertaining to "back-end" multi-level metallization processing of semiconductor devices, i.e., variation in vertical capacitance and overetching of borderless vias. In a first step according to the inventive process, shown in FIG. 5(A), first, low k ILD layer 35 comprising a material such as is described above, is formed according to conventional deposition processing, such as spin coating, so as to fill the spaces or gaps between adjacent features and form an overburden layer of varying thickness including recessed portion(s) 35A, similar to that shown in FIG. 4. Then, a patterned layer 39 of an etch-resistant mask material, typically a photoresist, is selectively formed in the recessed portion(s) 35A of the first, low k ILD layer 35, as by conventional photolithographic masking and etching techniques.

Figure 5A:
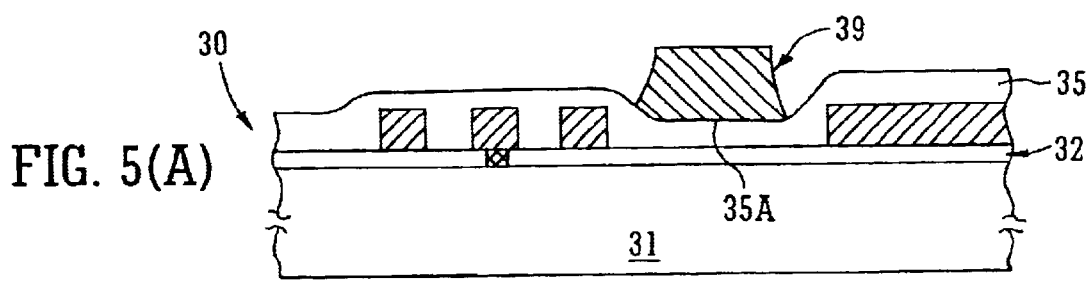
FIGS. 5(A)–5(D) illustrate, in simplified cross-sectional form, a sequence of processing steps for forming a semiconductor device having an "in-laid" metallization system including bordered and borderless vias formed according to the inventive methodology.
Figure 5B:
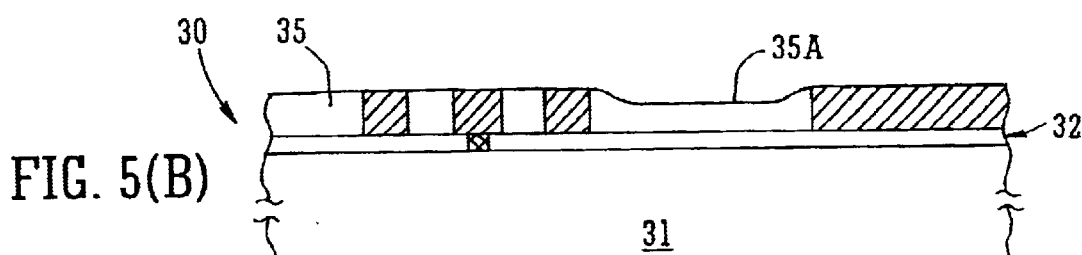

Adverting to FIG. 5(B), in the next step, the varying thickness overburden portions of first, low k ILD layer 35 are removed by a wet or dry etching process, thereby making the upper surfaces of the gap-filling portions of layer 35 substantially co-planar with the upper surfaces of features 33A–33C and 34 and reducing the depth of recessed portion 35A vis-a-vis the planarized surfaces. Given the present disclosure and objectives of the present invention, the etching procedure may be optimized for use in particular situations. For example, wet etching of conventional, low k dielectric materials such as those enumerated above and contemplated for use in the present invention, may be performed with the use of conventional wet chemical etchant solutions. Alternatively, dry etching may be effected with RF reactive plasmas comprising fluorine-containing gases. In either instance, etching end-points can be conveniently determined by conventional analytical methods and technologies, e.g., by detection of the presence of metal from the upper surfaces of features 33A–33C and 34 by e.g., changes in spectroscopy or optical reflectivity. Following completion of planarization etching, mask portion 39 is then removed, as by conventional lift-off techniques.

Figure 5C:
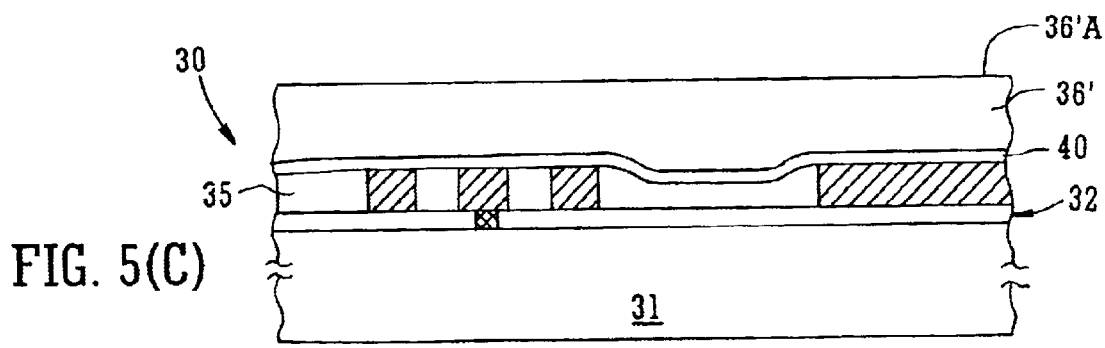

Referring now to FIG. 5(C), in the next step according to the invention, a relatively thin, second ILD layer 40 comprising a layer of a silicon oxide-based material, is formed over the planarized surface, as by conventional deposition techniques, e.g., chemical vapor deposition (CVD), plasma enhanced chemical vapor deposition (PECVD), or physical vapor deposition (PVD), followed by deposition thereon of a relatively thick, third, low k ILD layer 36', typically of a material selected from those enumerated above for use as the first, low k layer silicon oxide layer 35 and of thickness similar to that employed for layer 36 of FIG. 4. A distinctive feature of the present invention is the selection of a particular combination of second and third ILD layer materials such that the relatively thin, second ILD layer etches at a substantially lower rate than the third, relatively thick ILD layer for a given etchant and/or etching process. Another distinctive feature of the present invention is the substantial planarity of the as-deposited upper surface 36'A of layer 36 resulting from the substantial planarity of the underlying strata, whereby additional planarization processing (as by CMP) for achieving uniform thickness of the ILD layers, may be advantageously omitted if desired.

Figure 3:
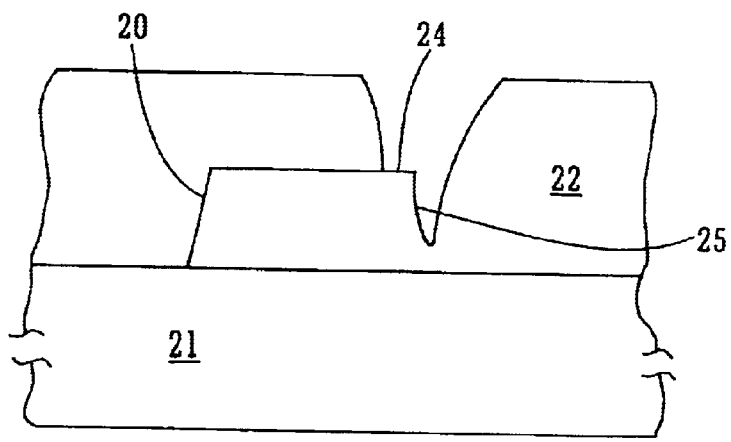
FIG. 3 illustrates, in simplified cross-sectional form, a portion of a semiconductor device "back-end" metallization system including a borderless via formed according to the conventional art.
Figure 5D:
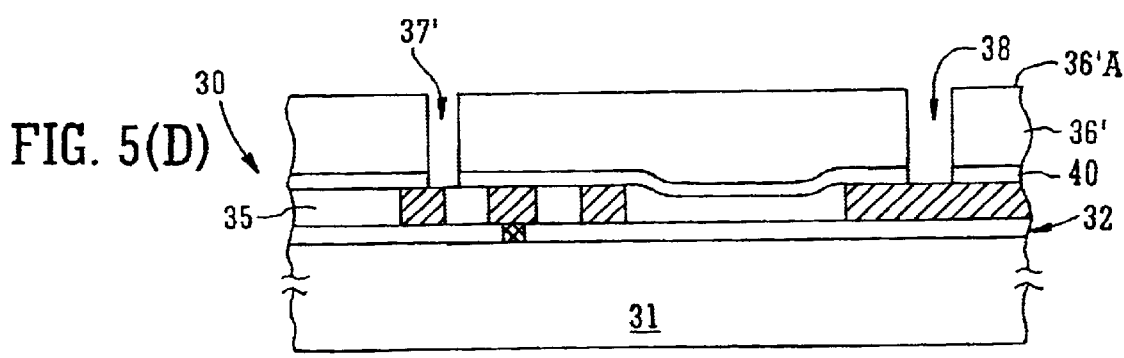

In the next step according to the present invention, shown in FIG. 5(D), borderless and fully bordered vias 37' and 38, respectively, are formed by selectively etching, as by conventional photolithographic masking techniques, through the second and third ILD layers 40 and 36', respectively, utilizing an etchant and/or etching process which is substantially, but not completely, selective against the third, low k ILD layer 36', whereby second ILD layer 40 functions in the manner of a partial etch stop, or etch moderating layer for preventing, or at least minimizing over-etching of the borderless via 37', for example, as is illustrated in FIG. 3. Given the present disclosure and objectives of the invention, determination of suitable materials for use as the second and third ILD layers, as well as choice of etchant and/or etching technique for partially selective etching thereof, is within the scope of ordinary skill for use in a particular situation. As is evident from FIG. 5(D), borderless via 37' formed according to the inventive methodology wherein over-etching of the dielectric material is substantially prevented, or at least minimized, comprises a substantially constant width opening having a substantially flat bottom surface 37'A, which together facilitate voidless filling of the via with a metal plug in a subsequent step (not shown).

The present invention thus enables formation of semiconductor devices comprising reliable, submicron-dimensioned, multi-level "back-end" metallization systems with reduced variation in vertical capacitance and reduced incidence of voids in metal-filled borderless vias, as well as reduced incidence of short-circuits due to over-etching of inter-layer dielectrics during borderless via formation. Moreover, the inventive method can be practiced at manufacturing rates consistent with the requirements for economic competitiveness, and is fully compatible with conventional process flow for automated manufacture of high-density integration semiconductor devices.

In the previous description, numerous specific details are set forth, such as specific materials, structures, reactants, processes, etc., in order to provide a better understanding of the present invention. However, the present invention can be practiced without resorting to the details specifically set forth. In other instances, well-known processing materials and techniques have not been described in order not to unnecessarily obscure the present invention.

Only the preferred embodiment of the present invention and but a few examples of its versatility are shown and described in the present disclosure. It is to be understood that the present invention is capable of use in various other combinations and environments and is susceptible of changes and/or modifications within the scope of the inventive concept as expressed herein.

What is claimed is:

1. A method of manufacturing a semiconductor device comprising a multi-layer metallization system having reduced variation of vertical capacitance, which method comprises the sequential steps of:
   (a) providing a substrate comprising a laterally extending surface having a plurality of spaced apart, electrically conductive features formed thereon, said plurality of features including relatively narrow and relatively wide features with relatively narrow and relatively wide spaces between adjacent features;
   (b) forming a first, blanket layer of a low dielectric constant ("low k") material over said substrate surface, said blanket layer filling the spaces between adjacent features and covering said features, the thickness of said blanket layer varying over said laterally extending surface and including thinner, recessed portions in the relatively wide spaces between adjacent features and thicker, non-recessed portions;
   (c) selectively forming a layer of an etch-resistant mask material over the thinner, recessed portions of said blanket layer;
   (d) selectively etching the thicker, non-recessed portions of said blanket layer of first, low k material exposed by said layer of mask material to substantially planarize the surface thereof;
   (e) removing the layer of etch-resistant mask material;
   (f) successively forming a relatively thinner layer of a second, oxide-based dielectric material and a relatively thicker layer of a third, low k material on the planarized surface of said layer of first, low k material; and
   (g) forming at least one via extending through said second and third dielectric material layers by an etching process.

2. The method as in claim 1, wherein step (g) comprises forming said at least one via as a borderless via for electrically contacting a said relatively narrow feature by an etching process, wherein the second, oxide-based dielectric material layer is etched at a rate substantially lower than the rate of etching of the third, low k layer, whereby the second dielectric layer functions as a partial etch stop or moderating layer preventing over-etching of the borderless via.

3. The method as in claim 1, wherein step (a) comprises providing a semiconductor wafer substrate having a dielectric layer formed thereon and comprising said laterally extending surface, and said plurality of electrically conductive features comprise electrical contact areas, interlevel metallization, and/or interconnection routing of at least one active device region or component formed on or within said semiconductor wafer.

4. The method as in claim 3, wherein said semiconductor wafer substrate comprises silicon or gallium arsenide.

5. The method as in claim 1, wherein step (b) comprises forming said blanket layer of a first, low k material from the group consisting of hydrogen silsesquioxane (HSQ), benzocyclobutene (BCB), polytetrafluoroethylene (TEFLON™), parylene, and polyimide.

6. The method as in claim 1, wherein step (c) comprises forming a patterned layer of a photoresist material.

7. The method as in claim 1, wherein step (d) comprises wet or dry etching of said blanket layer of first, low k material.

8. The method as in claim 1, wherein step (f) comprises successively forming a relatively thin, second dielectric material layer comprising a silicon oxide layer and a relatively thicker layer of a third, low k material.

9. The method as in claim 8, wherein said third, low k material comprises a material selected from the group consisting of hydrogen silsesquioxane (HSQ), benzocyclobutene (BCB), polytetrafluoroethylene (TEFLON™), parylene, and polyimide.

10. The method as in claim 9, wherein step (g) comprises forming said at least one via by preferentially etching said layer of third dielectric material.

11. The method as in claim 1, comprising the further step (h) of filling said at least one via with a plug of an electrically conductive material.

12. A method of manufacturing a semiconductor device comprising a multi-layer metallization system having reduced variation of vertical capacitance, which method comprises the sequential steps of:

(a) providing a silicon wafer substrate having a laterally extending major surface with a dielectric layer formed thereon, with a plurality of spaced-apart, electrically conductive features formed in or on a surface of said dielectric layer for providing electrical contact areas, interlevel metallization, and/or interconnection routing of at least one active device region or component formed on or within said wafer substrate, said plurality of conductive features including relatively narrow and relatively wide features with relatively narrow and relatively wide spaces between adjacent features;

(b) forming a blanket layer of a first, low k material filling the spaces between adjacent features and covering said features, the thickness of said blanket layer varying over the laterally extending surface of said wafer substrate and including thinner, recessed portions in the relatively wide spaces between adjacent features and non-recessed portions;

(c) selectively forming a layer of an etch-resistant mask material over said recessed portions of said blanket layer;

(d) selectively etching said thicker, non-recessed portions of said blanket layer of first low k material, thereby substantially planarizing the surface thereof;

(e) removing said layer of etch-resistant mask material;

(f) successively forming a relatively thinner layer of a second, oxide-based dielectric material and a relatively thicker layer of a third, tow k material on said planarized surface of said layer of first, low k material;

(g) forming at feast one via extending through said second and third dielectric layers by means of an etching process wherein said layer of third, low k material is etched at a substantially greater rate than said layer of second dielectric material, thereby preventing or substantially reducing, over-etching of sail at least one via; and (h) filling said at least one via with a plug of an electrically conductive material.

13. The method as in claim 12, wherein step (f) comprises forming a relatively thinner, second dielectric material layer comprising a silicon oxide-based layer and a relatively thicker, third, low k layer.

14. The method as in claim 13, wherein step (g) comprises forming said at least one via as a borderless via for electrically contacting a said relatively narrow feature.

* * * * *

UNITED STATES PATENT AND TRADEMARK OFFICE
CERTIFICATE OF CORRECTION

PATENT NO. : 6,660,618 B1  
DATED : December 9, 2003  
INVENTOR(S) : Susan H. Chen et al.

It is certified that error appears in the above-identified patent and that said Letters Patent is hereby corrected as shown below:

Column 14,
Line 9, change the word "feast" to -- least --

Signed and Sealed this

Fourteenth Day of September, 2004

JON W. DUDAS
*Director of the United States Patent and Trademark Office*